United States Patent [19]

Tsugaru et al.

[11] Patent Number: 4,798,981
[45] Date of Patent: Jan. 17, 1989

[54] INPUT CIRCUIT

[75] Inventors: Kazunori Tsugaru; Yasuhiro Sugimoto, both of Yokohama, Japan

[73] Assignee: Kabushiki Kaisha Toshiba, Kawasaki, Japan

[21] Appl. No.: 28,385

[22] Filed: Mar. 20, 1987

[30] Foreign Application Priority Data

Mar. 31, 1986 [JP] Japan .................................. 61-72843

[51] Int. Cl.[4] .................. H03K 19/097; H03K 19/086
[52] U.S. Cl. ..................................... 307/475; 307/446; 307/570; 307/264
[58] Field of Search ................. 307/475, 446, 570, 264

[56] References Cited

U.S. PATENT DOCUMENTS

| 4,453,095 | 6/1984 | Wrathall | 307/475 |
| 4,629,913 | 12/1986 | Lechner | 307/475 |
| 4,677,320 | 6/1988 | Hannington | 307/475 |
| 4,695,750 | 9/1987 | Hara et al. | 307/475 |
| 4,713,600 | 12/1987 | Tsugaru et al. | 307/264 |

FOREIGN PATENT DOCUMENTS 0068883 1/1983 European Pat. Off. .
3518413 11/1985 Fed. Rep. of Germany .

OTHER PUBLICATIONS

D. A. Hodges et al., "Interfacing," Analysis and Design of Digital Integrated Circuits, Chap. 7, Sec. 7, 1983.

Primary Examiner—John S. Heyman
Assistant Examiner—Richard Roseen
Attorney, Agent, or Firm—Finnegan, Henderson, Farabow, Garrett, & Dunner

[57] ABSTRACT

An input circuit is disclosed, which can be driven by a single power supply, and which can convert an ECL-level input signal falling to a negative voltage into a CMOS-level signal rising to a positive voltage, and can then supply this CMOS-level signal to an inner circuit. The input circuit comprises a transistor, a bias circuit, and a current-to-voltage converter. The emitter of the transistor is coupled to an input terminal for receiving a signal of a negative potential. The bias circuit applies a negative bias voltage to the base of the transistor. The current-to-voltage converter is connected to the collector of the transistor. The converter outputs a signal which first falls to a positive level and then rises to another positive level. That is, the input circuit can convert an input signal of a negative level to a signal of a positive level.

5 Claims, 2 Drawing Sheets

FIG. 1
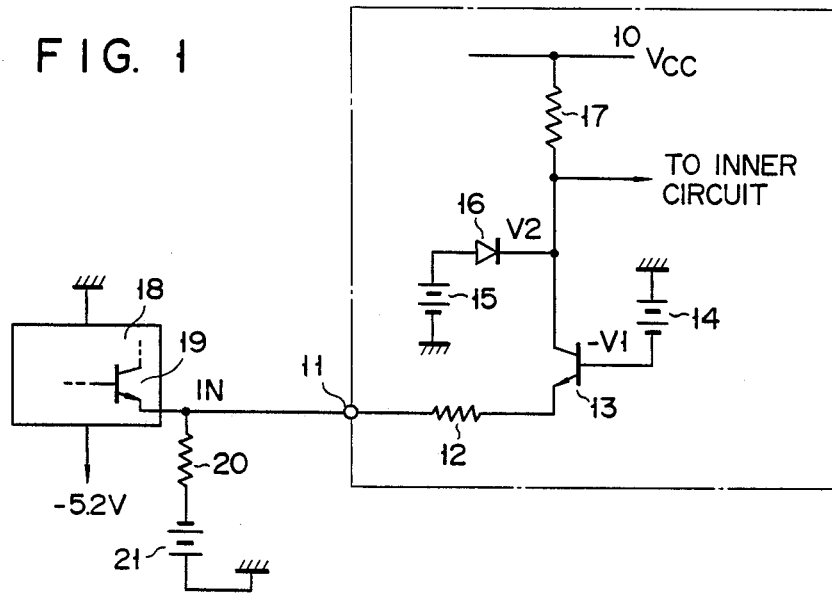
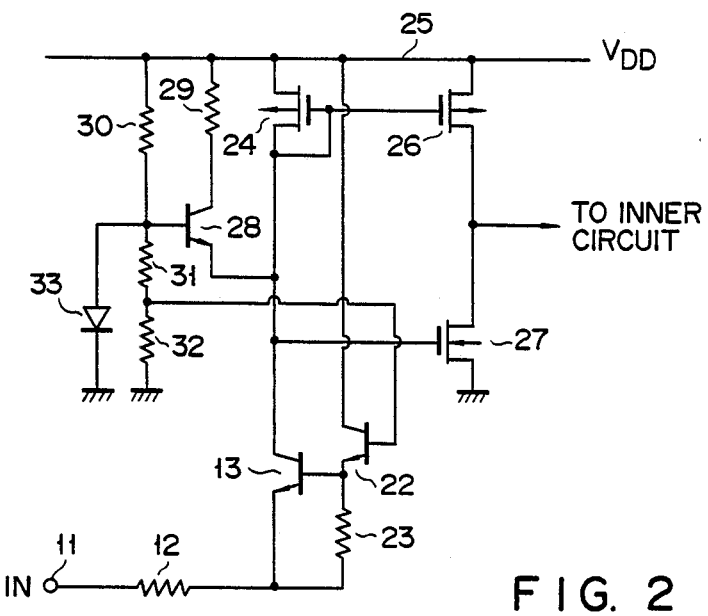
FIG. 2

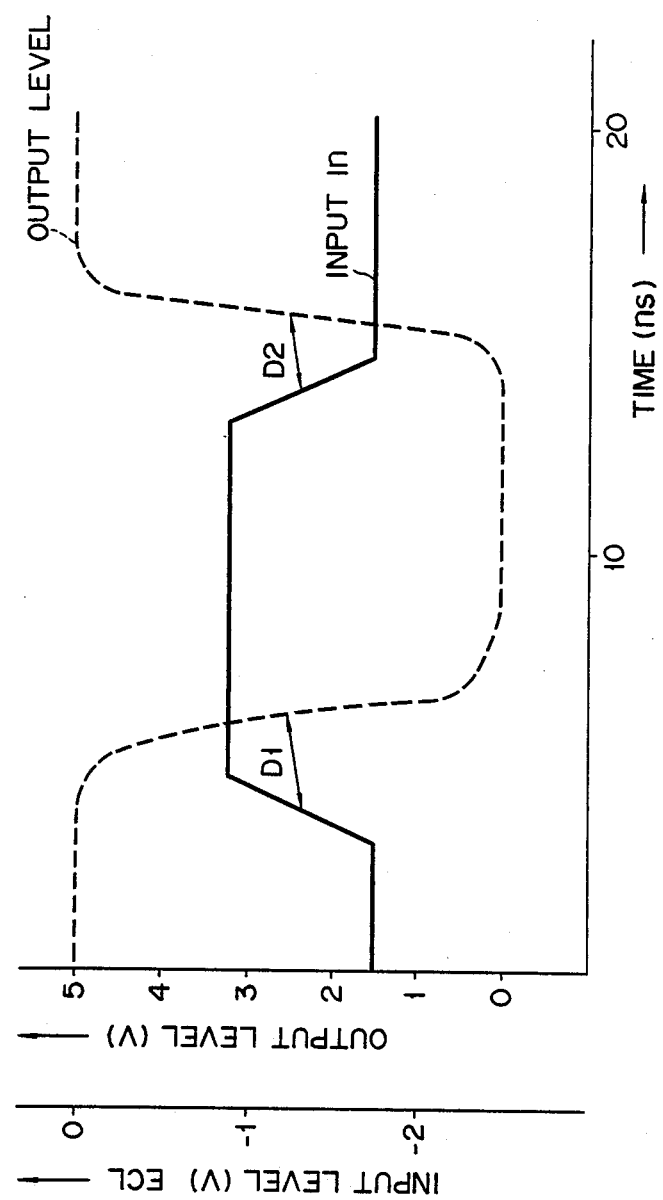

INPUT CIRCUIT

BACKGROUND OF THE INVENTION

The present invention relates to an input circuit for use in an integrated circuit, which is driven by a single, positive power supply and is designed to convert an input signal of a negative voltage to an output signal of a positive voltage. More particularly, the invention relates to an input circuit for use in a general logic circuit comprising a gate array, an ECL (Emitter-Coupled Logic) device, a TTL (Transistor-Transistor Logic) device, and a CMOS (Complementary MOS) device, which require input signals at different power supply levels and generate output signals at different voltage levels.

Generally, an ECL device can operate at high speed, but consumes much power. When the logic device coupled to the output of the ECL device does not need to operate at high speed, a TTL device, a CMOS device, and the like—each consuming little power—are used in combination with the ECL device.

There is known an input circuit for use in an integrated circuit comprising an ECL device, a TTL device, a CMOS device, and the like. This input circuit is integrated circuit MC10125, manufactured by Motorola, Inc. Circuit MC10125 converts an output signal of an ECL device, which first rises from $-1.7V$ to $-0.9V$ and then falls to $-1.7V$, to a signal required by a TTL device, which first falls from $+5.0V$ to $0V$ and then rises to $+5.0V$. This IC is driven by two power supplies, i.e., a $+5.0V$ power supply and a $-5.2V$ power supply. In short, circuit MC10125 converts an ECL-level signal to a TTL-level signal when it is driven by two power supplies.

The known input circuit is disadvantageous in two respects. First, it requires two power supplies, i.e., a positive power supply and a negative power supply. Secondly, the elements forming the input circuit must have a breakdown voltage of at least ten volts, in order to withstand both positive and negative power supply voltages. When this input circuit and other circuits are formed on a single chip, not only the elements of the input circuit, but also those of all other circuits must have the above-noted high breakdown voltage.

SUMMARY OF THE INVENTION

Accordingly, the object of the present invention is to provide an input circuit which can convert an ECL-level input signal falling to a negative voltage, into a CMOS-level signal rising to a positive voltage, and then supply this CMOS-level signal to an inner circuit.

According to the invention, an input circuit is provided, comprising an input terminal for receiving a signal at a negative potential, a bias circuit for applying a bias voltage at a negative level, a transistor, and a current-to-voltage converter for changing the positive voltage level of an output signal from a power supply, in accordance with the operation state of the transistor. The signal at a negative level is supplied from the input terminal to the emitter of the transistor. The bias voltage at a negative level is applied from the bias circuit to the base of the transistor. The signal at a negative potential is supplied from the input terminal to the emitter of the transistor. The transistor is turned on when this signal falls below the emitter potential of the transistor, i.e., the difference between the bias voltage and the base-emitter voltage of the transistor.

In the input circuit according to the present invention, bias voltage $-V1$ is applied to the base of the transistor, and input signal In at a negative potential level is input to the emitter of the transistor. The transistor is turned on when signal In falls below the emitter potential of the transistor, $(-V1 -VBE)$, where VBE is the base-emitter voltage of the transistor. In this case, a current flows to the input terminal from the power supply, through the current-to-voltage converter and the transistor. Hence, the current-to-voltage converter converts the current into a voltage having a different level from the positive power supply voltage $V_{CC}$. The output voltage of the current-to-voltage converter is supplied, as a positive-level output signal, to the inner circuit.

Conversely, when signal In rises to, or above, the emitter potential of the transistor, $(-V1 -VBE)$, the transistor is cut off. Hence, no current flows to the input terminal. In this case, the positive power supply voltage $V_{CC}$ is supplied to the inner circuit.

The input circuit of the invention can be driven by a single power supply. Therefore, the inner circuit need not be made of elements having a high breakdown voltage. The input circuit can thus be suitable for a bipolar CMOS logic IC which can be interfaced with an ECL IC.

BRIEF DESCRIPTION OF THE DRAWINGS

FIG. 1 is a basic circuit diagram showing the invention;

FIG. 2 is a circuit diagram of an embodiment of the invention; and

FIG. 3 illustrates the relationship between the input signal and output signal of the circuit shown in FIG. 2, this relationship having been obtained by simulation.

DETAILED DESCRIPTION OF THE PREFERRED EMBODIMENTS

First, an input circuit of the basic structure according to the present invention will be described, with reference to FIG. 1.

Input terminal 11 is coupled by resistor 12 to the emitter of NPN bipolar transistor 13. Bias voltage $-V1$ at a prescribed negative level is applied to the base of transistor 13, from first power supply 14 used as a bias circuit. A clamping circuit comprised of second power supply 15 and diode 16 is connected to the collector of transistor 13. This clamping circuit is designed to maintain the collector potential of transistor 13 always at a positive level. Further, resistor 17, which is used as a current-to-voltage converter, is also coupled, at one end, to the collector of transistor 13. The other end of resistor 17 is connected to third power supply 10. Third power supply 10 applies a positive voltage $V_{CC}$. When transistor 13 is on, resistor 17 reduces the voltage of a $V_{CC}$-level signal supplied from third power supply 10, in accordance with the collector current of transistor 13. A positive voltage, which is the difference between voltage $V_{CC}$ and the voltage drop caused by resistor 17, is applied to a circuit which requires this positive voltage and which will be called the inner circuit, constituted by a CMOS logic gate.

Input terminal 11 is also coupled to the emitter of the last-stage transistor 19 of ECL IC 18. Further, terminal 11 is coupled to one end of load resistor 20. The other end of resistor 20 is connected to the negative pole of fourth power supply 21. Fourth power supply 21 applies a negative voltage (−2.0V) to resistor 20, whereby a signal at ECL level (−2V to −1V) is applied to input terminal 11.

The operation of the input circuit shown in FIG. 1 will now be explained.

First power supply 14 applies a bias voltage −V1. Input signal In at ECL level is supplied to input terminal 11. When signal In falls to a level lower than −V1 −VBE 13, where VBE13 is the base-emitter voltage of transistor 13, transistor 13 is turned on. In this case, a current flows from third power supply 10 to input terminal 11, through resistor 17 and then through transistor 13. Resistor 17 causes a voltage drop at the collector of transistor 13. The voltage, obtained by subtracting this voltage drop from the output potential $V_{CC}$ of third power supply 10, is applied to the inner circuit.

Conversely, when input signal In rises to a level higher than −V1 −VBE13, transistor 13 is cut off. No current flows to input terminal 11. Hence, a $V_{CC}$-level signal is supplied to the inner circuit.

As can be understood from the above, transistor 13 is turned on or off as input signal In undergoes changes in level, thereby causing a resistor, functioning as a current-to-voltage converter, to change the level of the signal supplied to the inner circuit. In other words, the ECL-level changes of input signal In are transmitted to the inner circuit, in the form of a signal at $V_{CC}$-level signal or at a level lower than $V_{CC}$.

FIG. 2 is a circuit diagram showing the input circuit in greater detail. As is shown in this figure, the emitter of NPN bipolar transistor 13 is connected to input terminal 11 by resistor 12. The base of transistor 13 is coupled to the emitter of NPN bipolar transistor 22. Resistor 23 is connected to the node of the base of transistor 13 and the emitter of transistor 22. The collector of transistor 13 is connected by P-channel MOS transistor 24 to power supply line 25 for supplying power supply voltage $V_{DD}$. The collector of transistor 22 is also coupled to power supply line 25. The gate and drain of MOS transistor 24 are connected to each other. The gate of MOS transistor 24 is coupled to the gate of P-channel MOS transistor 26. The source of MOS transistor 26 is connected to power supply line 25. The drain of MOS transistor 26 is coupled to the drain of N-channel MOS transistor 27. MOS transistors 24 and 26 constitute a current mirror circuit. The gate of MOS transistor 27 is connected to the collector of transistor 13. The source of MOS transistor 27 is grounded. The collector of transistor 13 is connected to the emitter of NPN bipolar transistor 28. The collector of transistor 28 is connected by resistor 29 to power supply line 25. Further, resistors 30, 31, and 32 are connected in series between power supply line 25 and the ground. The node between resistors 30 and 31 is coupled to the base of transistor 28. The node between resistors 31 and 32 is coupled to the base of transistor 22. The anode of diode 33 is connected to the node between resistors 30 and 31, and the cathode of this diode is connected to the ground. In the circuit shown in FIG. 2, input signal In supplied to input terminal 11 is changed from ECL level to CMOS level, and the signal at CMOS level is supplied to an inner circuit, from the node between MOS transistor 26 and 27.

The section comprised of transistor 22, resistor 23, resistors 30-32, and diode 33 corresponds to first power supply 14 shown in FIG. 1. The section consisting of resistors 30-32 and diode 33 corresponds to second power supply 15, also shown in FIG. 1. P-channel MOS transistor 24 is used as the current-to-voltage converter, in place of resistor 17 employed in the input circuit of FIG. 1. NPN bipolar transistor 28 functions as a clamping circuit for preventing the collector potential of transistor 13 from falling below a ground potential, under any circumstances. Resistor 29 is provided to protect transistor 28.

The operation of the input circuit shown in FIG. 2 will now be explained.

The base potential of transistor 22 is approximately equal to R32/(R31+R32)·VF33, where R31 is the resistance of resistor 31, R32 is the resistance of resistor 32, and VF33 is the forward voltage drop of diode 33. Hence, when input signal In falls below the level of R32/(R31+R32)·VF33−2VBE, transistor 13 is turned on. Conversely, when input signal In rises above this level, transistor 13 is turned off. Bias voltage R32/(R31+R32)·VF33−1VBE, which is applied to the base of transistor 13, is assumed to be at a negative level which has been determined by selecting appropriate resistances for resistors 31 and 32.

Let us assume input signal In is below the level of R32/(R31+R32)·VF33−2VBE, and that transistor 13 is therefore on. Then, the potential at the node between the drain and gate of MOS transistor 24 is low. Hence, MOS transistor 26 is on, whereas MOS transistor 27 is off. In this case, a signal at the $V_{DD}$-level (i.e., the potential of power supply line 25) is supplied to the inner circuit.

On the other hand, when input signal In is at or above the level of R32/(R31+R32)·VF33−2VBE, transistor 13 is off. Therefore, the potential at the node between the drain and gate of MOS transistor 24 is high. MOS transistor 26 is thus off, whereas MOS transistor 27 is on. In this case, a signal at the ground potential is supplied to the inner circuit.

If, for some reason, the collector potential of transistor 13 falls, transistor 28 is turned on, thereby to prevent the collector potential of transistor 13 from falling below the ground potential.

FIG. 3 shows the relationship between the signal input to the input circuit of the invention and the signal output by the circuit. The graph of FIG. 3 has been drawn based on the results of calculating the conversion characteristic of the input circuit, by using the SPICE simulation program. As is shown in FIG. 3, when an ECL-level input signal, which rose from −1.74V to −0.92V and then fell to −1.74V, was supplied to the input circuit, the circuit produced a CMOS-level signal which fell from 5.0V to 0V and then rose to 5.0V. Signal-conversion period D1, i.e., the time lag between the rise of the input signal and the fall of the output signal, was 2.2 ns, and signal-conversion period D2, i.e., the time lag between the fall of the input signal and the rise of the output signal, was 1.8 ns. The average of periods D1 and D2 was 2.0 ns, which is half the signal-conversion period of 4.0 ns required in the conventional input circuits. The input circuit of the present invention can also convert input signals more quickly than the conventional input circuits.

What is claimed is:

1. An input circuit driven by a single power supply for providing an output signal at a non-negative CMOS potential level to an inner circuit, comprising:
   an input terminal for receiving an input signal at a negative ECL potential level;

means for providing the output signal at a non-negative CMOS potential level to the inner circuit;

a first transistor having an emitter, a collector, and a base, whose collector is coupled to the output signal providing means;

bias means coupled to the single power supply for applying a fixed bias voltage at a negative potential level to the base of said first transistor;

regulator means coupling the input terminal to the emitter of the first transistor, for regulating the amount of collector current of the first transistor; and current-to-voltage converting means, coupling the output signal providing means and the collector of the first transistor to the single power supply, for generating the output signal at a higher non-negative potential level when the first transistor is turned off by the input signal and for generating the output signal at a lower non-negative potential level when the first transistor is turned on by the input signal.

2. An input circuit according to claim 1, further comprising clamping means coupled to the single power supply and to the collector of the first transistor, for preventing a collector potential of said first transistor from falling below ground potential.

3. An input circuit according to claim 1, wherein said bias means includes a second transistor whose base is biased by an output of said clamping means, and a resistor connecting the emitter of said first transistor to the base of said first transistor and to an emitter of said second transistor.

4. An input circuit according to claim 2, wherein said clamping means includes a third transistor supplied with power from said single power supply, an emitter of said third transistor being coupled to the collector of said first transistor.

5. An input circuit according to claim 1, wherein said current-to-voltage converting means includes a P-channel MOS transistor supplied with power from said single power supply, a drain of said P-channel MOS transistor being coupled to the collector of said first transistor, and a gate and the drain of said P-channel MOS transistor being directly coupled to each other.

* * * * *